United States Patent [19]
Otsuka

[11] Patent Number: 6,021,071
[45] Date of Patent: Feb. 1, 2000

[54] SEMICONDUCTOR INTEGRATED CIRCUIT

[75] Inventor: Nobuaki Otsuka, Kawasaki, Japan

[73] Assignee: Kabushiki Kaisha Toshiba, Kawasaki, Japan

[21] Appl. No.: 09/215,234

[22] Filed: Dec. 18, 1998

[30] Foreign Application Priority Data

Dec. 22, 1997 [JP] Japan .................................. 9-353504

[51] Int. Cl.[7] .................................................. G11C 13/00
[52] U.S. Cl. .................................. 365/189.05; 365/189.09
[58] Field of Search .......................... 365/189.05, 189.09; 326/56, 57, 58

[56] References Cited

U.S. PATENT DOCUMENTS 5,136,542  8/1992  Abe et al. ............................ 365/189.05

OTHER PUBLICATIONS

Harold Pilo et la.: IEEE International Solid–State Circuits Conference; Session 9 SRAM FA 9.3: A 300MHz, 3.3V 1Mb SRAM Fabricated in a 0.5μm CMOS Process; 1996; pp. 1, 7 148–149.

*Primary Examiner*—Vu A. Le
*Attorney, Agent, or Firm*—Banner & Witcoff, Ltd.

[57] ABSTRACT

In an output circuit of a memory IC having a programmable impedance buffer function, the output circuit includes n MOS transistors having drains connected to an external output node and having channel widths increasing in progression from $2^0$ times to $2^{(n-1)}$ times the unit channel width, m output control signal lines connected to the gate nodes of m transistors which are part of the n MOS transistors, and state fixing lines connected to the gate electrodes of the remaining (n−m) transistors among the n MOS transistors, for fixedly setting the (n−m) transistors into the nonconductive state. With this construction, the impedance matching precision is enhanced and the cost is lowered.

24 Claims, 5 Drawing Sheets

SEMICONDUCTOR INTEGRATED CIRCUIT

BACKGROUND OF THE INVENTION

This invention relates to a semiconductor integrated circuit and more particularly to a circuit for adjusting the output impedance of an output circuit and can be applied to a data output circuit of a semiconductor memory having a programmable impedance control function, for example.

With the improvement of the performance of an MPU (microprocessor), the data transfer speed required in memories is steadily enhanced. The operation frequency of a memory used in an external cache memory, for example, exceeds one hundred MHz.

In order to transfer output data of the semiconductor memory to the MPU in the above frequency range, it becomes necessary to attain matching between the impedance of the output circuit of the memory side and the impedance of the data bus on the board by taking into consideration the signal reflection at the data bus on the board on which the MPU and memory are mounted. With an increase in the operation frequency, the precision of the impedance matching becomes more strict.

Therefore, a function for correcting the deviation of an impedance value from the impedance value set at the time of design of the output circuit of the memory is used. More specifically, if the effective driving ability of the transistor of the output circuit is changed in an environment in which the circuit is actually used owing to variations in the manufacturing process and the temperature, the driving ability of the transistor is adjusted to a desired value by changing the transistor size of the output circuit in the circuit operation to correct the variations.

As an example of a circuit for attaining the above method, a programmable impedance buffer circuit shown in FIG. 5 of ISSCC96 FA9.3: A 300 MHz, 3.3 V 1 Mb SRAM Fabricated in a 0.5 $\mu$m CMOS Process is provided and the circuit is briefly explained below.

FIG. 9 Shows the conventional programmable impedance buffer circuit disclosed in the above document.

An SRAM having the programmable impedance buffer circuit has such a function (programmable impedance buffer function) that the size (current driving ability) of an output driving transistor will be automatically changed to attain matching between the output impedance of an output circuit 40 and the impedance of an element RQ when the user externally connects the element RQ having a desired value to an external terminal VZQ as the impedance of an output bus to be connected to an output terminal DQ.

That is, in the SRAM, as a means for changing the size of the output driving transistor, four pull-up side output driving transistors 1Y, 2Y, 4Y, 8Y and four pull-down side output driving transistors 1Z, 2Z, 4Z, 8Z respectively having sizes of 1×Wu, 2×Wu, 4×Wu, 8×Wu with respect to the size Wu of a unit transistor are prepared.

As an output impedance evaluation circuit 41, four evaluation transistors 1X, 2X, 4X, 8X having sizes equal to, two times, four times and eight times the size of a unit transistor are prepared, and the size of the evaluation transistor is variably changed by controlling the gates of the four evaluation transistors 1X, 2X, 4X, 8X by use of bits of evaluation control signals A0 to A3 of four bits from a control circuit 42 to selectively control the ON/OFF states of the four evaluation transistors 1X, 2X, 4X, 8X.

The control signals A0 to A3 are changed while monitoring the impedance matching state between the evaluation transistors and the element RQ and the contents of the evaluation control signals A0 to A3 set when the matching is attained are stored.

Control signals D0 to D3 of four bits output from the control circuit 42 at adequate timings based on the contents of the stored evaluation control signals A0 to A3 are subjected to the logical process together with other control signals DOCD, OE in a logic gate circuit 44. The gates of the output driving transistors (1Y, 2Y, 4Y, 8Y; 1Z, 2Z, 4Z, 8Z) are controlled by the signals subjected to the logical process to selectively control the ON/OFF states of the output driving transistors so that the size of the output driving transistor can be changed in a range from 0×Wu to 15×Wu.

In practice, an offset transistor Y0 which is normally set in the ON state is added to the output driving transistors 1Y, 2Y, 4Y, 8Y and an offset transistor Z0 which is normally set in the ON state is added to the output driving transistors 1Z, 2Z, 4Z, 8Z, and as shown in FIG. 10, 16 stages of sizes can be realized in the unit of the size Wu of the unit transistor in the variable range from the size Won of the offset transistor Y0 or Z0 to the total size (Won+15×Wu) of all of the transistors.

Likewise, an offset transistor X0 which is normally set in the ON state is added to the evaluation transistors 1X, 2X, 4X, 8X and 16 stages of sizes can be realized in the unit of the size of the unit transistor in the variable range from the size of the offset transistor X0 to the total size of all of the transistors.

If the number of the output driving transistors (1Y, 2Y, 4Y, 8Y), the number of the output driving transistors (1Z, 2Z, 4Z, 8Z) and the number of bits of the control signals C0 to C3 are expressed by m, the variable number of sizes of the output driving transistors is defined by $2^m$, and in this example, it is $2^4=16$.

The value of m is determined by the precision of matching and the range of the impedance to be actually covered by the output circuit 40. That is, the size of the output circuit 40 can be set only to a digital value with the size Wu of the unit transistor set as a minimum step and may be deviated by Wu at maximum from a size corresponding to a desired impedance, and therefore, the size Wu of the minimum step is determined by the impedance matching precision.

Further, since the size of the output driving transistor corresponding to the upper limit of the impedance to be covered is set to the size Won of the offset transistor Y0 or Z0 and the size of the output driving transistor corresponding to the lower limit of the impedance to be covered is set to the size (Won+($2^m$−1)×Wu), the values of Won and m are determined based on these values.

As is clearly understood from the above explanation, it is necessary to increase the number m of bits of the control signals and reduce the size Wu of the minimum step in order to enhance the precision of the impedance matching.

However, if the number m of bits of the control signals is increased, the number of control signals supplied to the output circuit 40 is increased and it is desirable to set the value of m as small as possible from the viewpoint of the circuit design. Therefore, the number m of bits of the control signals is determined (m=4 in the above example) by taking the range of impedance to be covered, matching precision, cost and the like into consideration.

As described above, the size of the output driving transistors necessary for realizing a desired impedance is changed in the unit of specified size Wu, but in practice, the current driving ability of the MOS transistor constituting the output driving transistor determines the impedance and it is roughly determined by W/L (W is the channel width of the MOS transistor and L is the channel length or gate width of the MOS transistor). Therefore, if the gate width L of the output driving transistor is changed, it becomes necessary to change the channel width W of the output driving transistor so as to adjust the impedance.

Generally, the gate width L of the MOS transistor is determined by the manufacturing process of a generation to which it belongs and it is a common practice to use a minimum constant value in a range in which no special problem occurs in the characteristics for constructing circuits.

However, the output driving transistor drives a large load of an external portion of the IC chip and requires a large current driving ability unlike a transistor for driving the gate circuit of an internal portion of the IC chip. Therefore, time in which the output driving transistor permits current flow in the transient state becomes longer than that in the other MOS transistor (MOS transistor in the internal circuit) and deterioration in the reliability due to hot carriers generated during the current flow becomes serious because time for permitting a current to flow is long. Thus, it is general to design the gate width L of the output driving transistor to be longer than the gate width L of the MOS transistor of the internal circuit.

Further, the drain of the output driving transistor is applied with a serge (ESD) due to static electricity applied to the external pin of the IC via the output terminal DQ and it is necessary to increase the gate width L in order to attain a sufficiently high withstand voltage against the ESD.

However, if the gate width L of the MOS transistor is increased, the performance of the MOS transistor is lowered, and particularly, the output driving transistor has a large influence on the performance of the IC chip because the load to be driven is large. As a result, it is important to use the minimum gate width L if no problem of reliability or no influence of ESD occurs.

In practice, however, the influence of the ESD withstand voltage is not clear if it is not evaluated by use of the actual IC chip. This because the ESD withstand voltage is largely dependent on the IC manufacturing process, package, protection circuit and other factors and cannot be previously simulated with high precision as in the circuit characteristic.

The gate width L of the output driving transistor must be often changed from a value previously set at the time of design as the result of evaluation by use of the actual IC chip. The reliability of the MOS transistor can be more clearly predicted based on the data base in comparison with the ESD.

However, the manufacturing process actually used is not necessarily kept unchanged from the process predicted at the time of design and time for permitting the current to flow in the output driving transistor is largely dependent on the output load or the like, it is necessary to effect the evaluation by use of the actual IC chip and the gate width L of the output driving transistor may be corrected in some cases after the design of the IC chip.

In practice, at the time of layout design of the output driving transistor, it is a common practice to make the design in preparation for the change of the gate width L and channel width W and a polysilicon wiring which is used as a gate may be formed so that the width thereof can be changed for the gate width L of the output driving transistor.

However, if the channel width W of the output driving transistor is changed, the widths of the diffusion regions (drain and source regions) will be changed and it is necessary to restart the manufacturing process from the first step, the TAT (Turn-Around Time) becomes extremely long, and the manufacturing lot in which the diffusion regions are already formed becomes useless.

Therefore, a plurality of MOS transistors having different sizes are prepared and option lines or wirings for selectively connecting/disconnecting them by use of aluminum wirings are used to adjust the size of the MOS transistor.

That is, in order to increase the design size (channel width W) of the MOS transistor by 20%, transistors with a size of ⅕ of the design size may be additionally connected in parallel.

Therefore, if a plurality of types of MOS transistors of sizes smaller than the design size of the MOS transistor are prepared, the size of the MOS transistor can be changed. If the total sum of the sizes becomes equal to twice the design size, the gate width L can be changed to approximately twice the original gate width.

The change of the size of the MOS transistor for the programmable impedance buffer circuit as described before is considered. In this case, as described before, it is necessary to prepare MOS transistors having determined sizes such as two times, four times, . . . with the minimum step size Wu used as the unit.

In order to adjust the channel width W of the output driving transistor as described before, it is necessary to prepare a plurality of fine adjustment MOS transistors for each of the MOS transistors so that the size adjustment can be attained at the same ratio for the MOS transistors Z0, 1Z, 2Z, 4Z, 8Z having the sizes Won, Wu, 2×Wu, 4×Wu, . . . , $2^{(m-1)}$×Wu as in the pull-down side output driving transistors shown in FIG. 11, for example.

In this case, if four fine adjustment transistors are used for each of the transistors Z0, 1Z, 2Z, 4Z, 8Z of five types of sizes (Won, Wu, 2×Wu, 4×Wu, 8×Wu), it is necessary to prepare 5×4=20 fine adjustment transistors and it requires an extremely large area on the layout.

Further, the minimum step size Wu is a small value, but the size of the fine adjustment transistor is set to a smaller value. If, for example, the circuit shown in FIG. 11 is realized by the manufacturing process of 0.4 μm generation, the minimum step size Wu of the impedance matching transistor becomes approx. 2 μm and the fine adjustment transistor has a size in a range in which the narrow channel effect will occur.

The basic reason for causing the above problem in the conventional output circuit having the programmable impedance buffer function is that the fine adjustment transistors are provided for each of the transistors (transistors having the offset size Won and m different sizes Wu, 2×Wu, 4×Wu, . . . , $2^{(m-1)}$×Wu corresponding to the control signals of m bits) constituting the output driving transistor.

As described above, in a case wherein the conventional semiconductor integrated circuit has the programmable impedance buffer function which makes it possible to adjust the impedance of the output circuit according to the external impedance, there occurs a problem that the matching with respect to the manufacturing process is extremely bad if size adjustment transistors are provided for an output driving transistor in which the gate width L may be changed after the ESD withstand voltage and reliability are evaluated on the actual IC chip after the design.

BRIEF SUMMARY OF THE INVENTION

This invention has been made to solve the above problem and an object of this invention is to provide a semiconductor integrated circuit which can be provided at a low cost and in which the matching precision of the impedance can be enhanced when the programmable impedance buffer function is provided for the output circuit.

According to a first aspect of the present invention, there is provided a semiconductor integrated circuit comprising n MOS transistors having current paths connected at one-side ends to an external output node and having channel widths increasing in progression from $2^0$ times to $2^{(n-1)}$ times the unit channel width; m output control signal lines connected to gate nodes of m transistors which are part of the n MOS transistors, where n>m; and state fixing lines connected to gate electrodes of the remaining (n–m) transistors among the n MOS transistors, for fixedly setting the (n–m) transistors into the nonconductive state.

In the semiconductor integrated circuit according to the first aspect of the present invention, output control signals supplied to the m output control signal lines may be signals obtained by logically processing an output permission control signal for controlling whether the m MOS transistors can be made conductive or not, an output. impedance control signal for selectively controlling the conduction states of the m MOS transistors to control the output impedance of the external output node to a desired value, and output data from an internal circuit of the integrated circuit.

In the semiconductor integrated circuit according to the first aspect of the present invention, the semiconductor integrated circuit may further comprise p MOS transistors whose current paths are connected at one-side ends to the external output node; and state fixing lines for selectively coupling the gate nodes of the p MOS transistors to a fixed level for setting the nonconductive state or a fixed level for setting the conductive state to selectively fix the p MOS transistors in the nonconductive or conductive state. In the semiconductor integrated circuit, output control signals supplied to the m output control signal lines may be signals obtained by logically processing an output permission control signal for controlling and permitting the m MOS transistors to be set in the output permissible state, an output impedance control signal for selectively controlling the conduction states of the m MOS transistors to control the output impedance of the external output node to a desired value, and output data from an internal circuit of the integrated circuit.

In the semiconductor integrated circuit according to the first aspect of the present invention, the semiconductor integrated circuit may comprise an output circuit including a pull-up circuit and in which the MOS transistors are used in the pull-up circuit of the output circuit of the integrated circuit.

In the semiconductor integrated circuit according to the first aspect of the present invention, the semiconductor integrated circuit may comprise an output circuit including a pull-down circuit and in which the MOS transistors are used in the pull-down circuit of the output circuit of the integrated circuit.

In the semiconductor integrated circuit according to the first aspect of the present invention, the semiconductor integrated circuit may comprise an output circuit including a pull-up circuit and pull-down circuit and in which the MOS transistors are used in the pull-up circuit and pull-down circuit of the output circuit of the integrated circuit.

In the semiconductor integrated circuit according to the first aspect of the present invention, the output control signal lines and state fixing lines may be option lines. In the semiconductor integrated circuit, the option lines may be determined as the result of evaluation of at least one performance characteristic on an actual IC chip. In the semiconductor integrated circuit, the at least one performance characteristic may contain a performance characteristic of ESD withstand voltage and reliability.

In the semiconductor integrated circuit according to the first aspect of the present invention, the n MOS transistors may be N channel MOS transistors.

In the semiconductor integrated circuit according to the first aspect of the present invention, wherein the n MOS transistors may be P channel MOS transistors.

According to a second aspect of the present invention, there is provided a semiconductor integrated circuit comprising n MOS transistors having current paths connected at one-side ends to an external output node and having channel widths different from each other; m output control signal lines connected to gate nodes of m transistors which are part of the n MOS transistors, where n>m; and state fixing lines connected to gate electrodes of the remaining (n–m) transistors among the n MOS transistors, for fixedly setting the (n–m) transistors into the nonconductive state.

In the semiconductor integrated circuit according to the second aspect of the present invention, output control signals supplied to the m output control signal lines may be signals obtained by logically processing an output permission control signal for controlling whether the m MOS transistors can be made conductive or not, an output. impedance control signal for selectively controlling the conduction states of the m MOS transistors to control the output impedance of the external output node to a desired value, and output data from an internal circuit of the integrated circuit.

In the semiconductor integrated circuit according to the second aspect of the present invention, the semiconductor integrated circuit may further comprise p MOS transistors whose current paths are connected at one-side ends to the external output node; and state fixing lines for selectively coupling the gate nodes of the p MOS transistors to a fixed level for setting the nonconductive state or a fixed level for setting the conductive state to selectively fix the p MOS transistors in the nonconductive or conductive state. In the semiconductor integrated circuit, output control signals supplied to the m output control signal lines may be signals obtained by logically processing an output permission control signal for controlling and permitting the m MOS transistors to be set in the output permissible state, an output impedance control signal for selectively controlling the conduction states of the m MOS transistors to control the output impedance of the external output node to a desired value, and output data from an internal circuit of the integrated circuit.

In the semiconductor integrated circuit according to the second aspect of the present invention, the semiconductor integrated circuit may comprise an output circuit including a pull-up circuit and in which the MOS transistors are used in the pull-up circuit of the output circuit of the integrated circuit.

In the semiconductor integrated circuit according to the second aspect of the present invention, the semiconductor integrated circuit may comprise an output circuit including a pull-down circuit and in which the MOS transistors are used in the pull-down circuit of the output circuit of the integrated circuit.

In the semiconductor integrated circuit according to the second aspect of the present invention, the semiconductor integrated circuit may comprise an output circuit including a pull-up circuit and pull-down circuit and in which the MOS transistors are used in the pull-up circuit and pull-down circuit of the output circuit of the integrated circuit.

In the semiconductor integrated circuit according to the second aspect of the present invention, the output control signal lines and state fixing lines may be option lines. In the semiconductor integrated circuit, the option lines may be determined as the result of evaluation of at least one performance characteristic on an actual IC chip. In the semiconductor integrated circuit, the at least one performance characteristic may contain a performance characteristic of ESD withstand voltage and reliability.

In the semiconductor integrated circuit according to the second aspect of the present invention, the n MOS transistors may be N channel MOS transistors.

In the semiconductor integrated circuit according to the second aspect of the present invention, the n MOS transistors may be P channel MOS transistors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described an embodiment of this invention with reference to the accompanying drawings.

Figure 1:
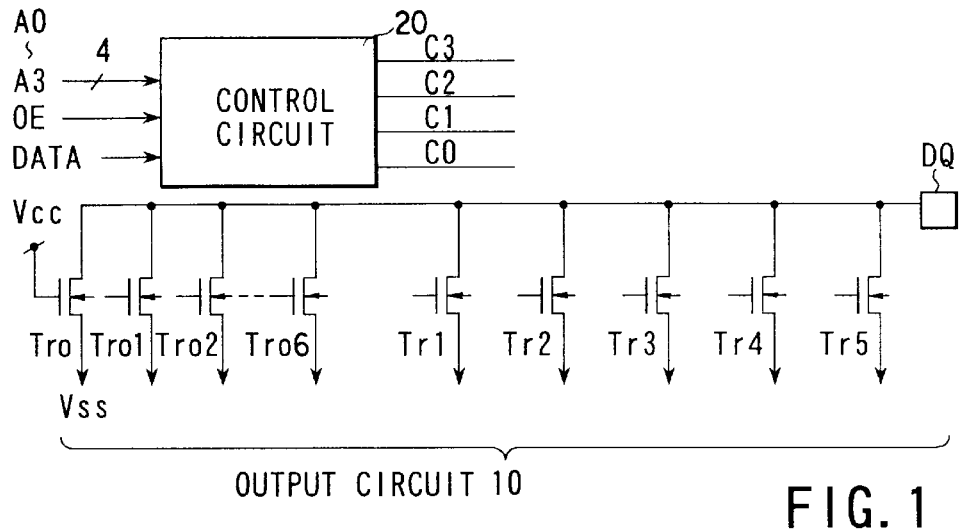
FIG. 1 is a circuit diagram showing one example of a state of the pull-down side of an output circuit of an IC having the programmable impedance buffer function according to an embodiment of a semiconductor integrated circuit of this invention prior to formation of an output driving control signal line in the wafer manufacturing process.

FIG. 1 shows one example of an equivalent circuit of the pull-down side circuit of an output circuit of a memory IC having the programmable impedance buffer function according to an embodiment of a semiconductor integrated circuit of this invention prior to formation of an output driving control signal line in the wafer manufacturing process.

Figure 2:
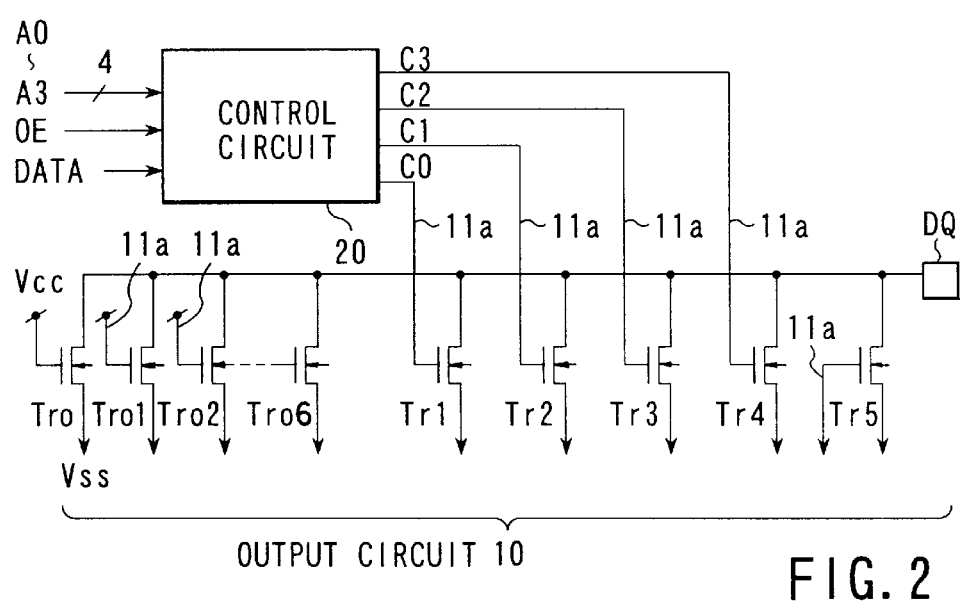
FIG. 2 is a circuit diagram showing one of two types of output circuits in which selective constituent elements of the output driving transistors of FIG. 1 are realized to change the range of the driving ability (the cover range of the output impedance) by use of the option lines.
Figure 3:
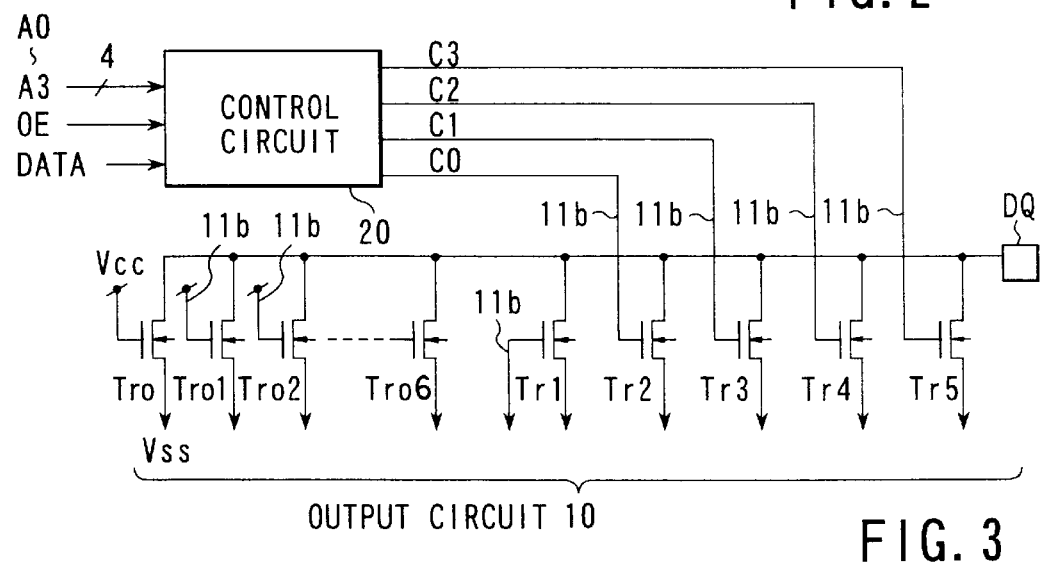
FIG. 3 is a circuit diagram showing the other of the two types of output circuits in which selective constituent elements of the output driving transistors of FIG. 1 are realized to change the range of the driving ability (the cover range of the output impedance) by use of the option lines.

FIGS. 2 and 3 show two types of output circuits in which selective constituent elements of the output driving transistors of FIG. 1 are realized to change the range of the driving ability (the cover range of the output impedance) by use of the option lines.

In an output circuit 10 of FIG. 1, a transistor Tro having the size Won and used as an offset transistor which is the constituent element of the output driving transistor and n (in this example n=5) transistors Tr1 to Tr5 which have different sizes and are larger in number than the number m of bits of output control signals C0 to C3 of four bits, for example, of a control circuit 20 are provided.

In this case, the transistors Tr1 to Tr5 have channel widths increasing in progression from $2^0$ times to $2^{(n-1)}$ times the unit channel width with the unit channel width (size) Wu of the transistor Tr1 used as a reference and the sizes are respectively set to Wu, 2×Wu, 4×Wu, 8×Wu, 16×Wu.

Further, p (in this example, p=6) fine adjustment transistors Tro1 to Tro6 are provided for the transistor Tro having the size Won and are connected in parallel to the transistor Tro.

The transistors Tro, Tro1 to Tro6, Tr1 to Tr5 are each formed of an N-channel MOS transistor and one-side ends (in this example, drains) of the current paths thereof are connected to an external output node via an output pad DQ, for example, and the sources thereof are connected to a node of the ground potential Vss in this example.

The number m of bits of the control signals C0 to C3 is determined by the range of the impedance actually covered by the output circuit 10 and the precision of impedance matching, and in this example, m is set to 4 as in the conventional case. Further, the fine adjustment transistors Tro1 to Tro6 are attached to the transistor Tro having the size Won so that the channel width W thereof can be increased to twice the original value, for example.

The connection relation between the gates of the five transistors Tr1 to Tr5 having the five different sizes Wu, 2×Wu, 4×Wu, 8×Wu, 16×Wu and the control signals C0 to C3 of four bits is determined after evaluating the ESD withstand voltage and reliability on the actual IC chip and the connection is made as shown in FIG. 2 or 3 by use of option lines such as aluminum wirings formed according to the top layer wiring mask pattern based on the above determination.

That is, if it is understood that the gate width L of the output driving transistor can be kept unchanged as the result of evaluation of the ESD withstand voltage and reliability of a sample of the IC chip obtained after the manufacturing process, option lines 11a are formed to couple the respective bits of the four control signals C0 to C3 to the gates of the four transistors Tr1 to Tr4 having the sizes Wu, 2×Wu, 4×Wu, 8×Wu as shown in FIG. 2 and fix the gate potential of the transistor Tr5 having the maximum size 16×Wu at the ground potential Vss so as to fixedly set the transistor in the nonconductive state and thus a product is formed.

At this time, option lines 11a for the fine adjustment transistors Tro1 to Tro6 are formed at the same time as formation of the above option lines 11a so that the gate nodes of the fine adjustment transistors Tro1 to Tro6 can be selectively coupled to the fixed level (ground potential Vss) for setting the nonconductive state or the fixed level (power supply potential Vcc) for setting the conductive state.

Therefore, for example, as shown in FIG. 2, if the gate nodes of the fine adjustment transistors Tro1 to Tro6 are connected to the Vcc node to set all of the fine adjustment transistors Tro1 to Tro6 into the use state (ON state), the channel width thereof can be increased to twice the original value.

Figure 4:
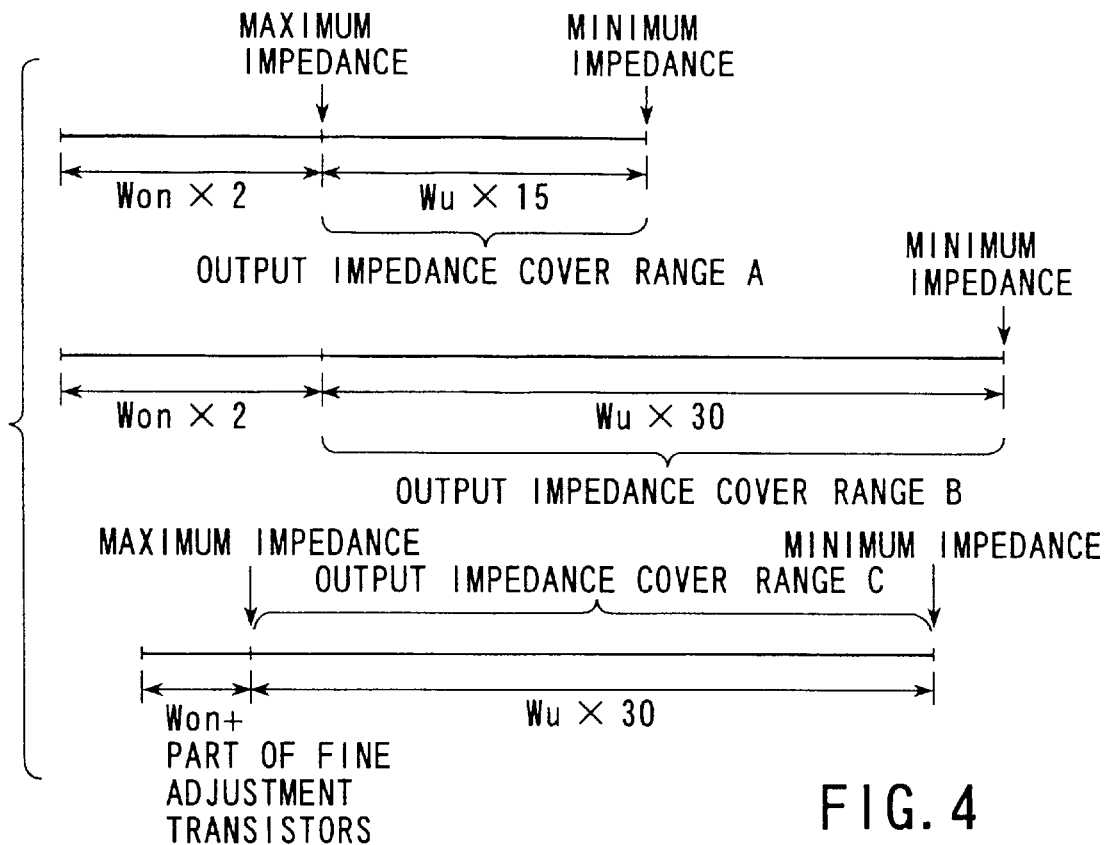
FIG. 4 is a diagram showing the variable ranges (the cover ranges of the output impedances) of the sizes of the output driving transistors realized by two types of circuit connections of FIGS. 2 and 3.

The variable range of the size (the cover range of the output impedance) of the output driving transistor by the control signals C0 to C3 in the IC manufactured as a product is shown by A in FIG. 4.

On the other hand, if it is understood that the gate width L of the output driving transistor must be increased as the result of evaluation of the ESD withstand voltage and reliability of a sample of the IC chip after the manufacturing process, the gate potential of the transistor Tr1 having the minimum step size Wu is fixed at the ground potential level Vss to fixedly set the transistor Tr1 in the nonconductive state as shown in FIG. 3. Further, option lines 11b are formed to couple the control signals C0 to C3 of four bits to the gates of the four transistors Tr2 to Tr5 having the sizes 2×Wu, 4×Wu, 8×Wu, 16×Wu (that is, set a connection state in which the control signals C0 to Z3 of four bits are shifted by one bit from the connection state of FIG. 2) and thus a product is formed.

At this time, option lines 11b for the fine adjustment transistors Tro1 to Tro6 are formed at the same time as formation of the above option lines 11b so that the gate nodes of the fine adjustment transistors Tro1 to Tro6 can be selectively coupled to the fixed level (ground potential Vss) for setting the nonconductive state or the fixed level (power supply potential Vcc) for setting the conductive state.

Therefore, for example, as shown in FIG. 3, if the gate nodes of the fine adjustment transistors Tro1 to Tro6 are connected to the Vcc node to set all of the fine adjustment transistors Tro1 to Tro6 into the use state (ON state), the channel width thereof can be increased to twice the original value.

The variable range of the size (the cover range of the output impedance) of the output driving transistor by the control signals C0 to C3 in the IC manufactured as a product is shown by B in FIG. 4.

According to the connection of FIG. 3, since the control range of the channel widths W of the four transistors Tr2 to Tr5 except the transistor Tr1, the fine adjustment transistors Tro1 to Tro6 and the transistor Tro having the size Won is twice as wide as the control range of the channel widths W of the four transistors Tr1 to Tr4 connected as shown in FIG. 2, then a reduction in the driving ability for the channel width W can be compensated for by changing the gate width L of the output driving transistor even if the driving ability for the channel width W is reduced by half.

In a case wherein the driving ability for the channel width W is reduced by an amount less than half by changing the gate width L of the output driving transistor, the impedance cover range will be deviated from a desired range in some cases if the transistor size is changed by two times as shown in the connection of FIG. 3 in comparison with the connection of FIG. 2.

In such a case, the fine adjustment transistors Tro1 to Tro6 are used and finely adjusted to increase the size of the transistor Tro having the size Won to a value which is smaller than twice the original value (the option lines 11b are formed to selectively set part of the fine adjustment transistors Tro1 to Tro6 into the ON state) so that the impedance can be changed and the variable range of the size (the cover range of the output impedance) of the output driving transistor by the control signals C0 to C3 can be set in a desired range as shown in FIG. 4.

That is, in the output circuit 10 shown in FIG. 1, the output driving transistors Tr1 to Tr5 having sizes changing in progression which are larger in number than the number m of control signal bits are provided without attaching the fine adjustment transistors to each of the transistors Tr1 to Tr5 and the fine adjustment transistors Tro1 to Tro6 are provided only for the transistor Tro.

The size of the output driving transistor can be adjusted in a range from (size Won+sizes of those of the fine adjustment transistors Tro1 to Tro6 which are used) to (size Won+sizes of those of the fine adjustment transistors Tro1 to Tro6 which are used+15×Wu) or the size of the output driving transistor can be adjusted in a range (size Won+sizes of those of the fine adjustment transistors Tro1 to Tro6 which are used) to (size Won+sizes of those of the fine adjustment transistors Tro1 to Tro6 which are used+30×Wu) by shifting the control signals of m bits to selectively couple the control signals of m bits to the gates of the transistors Tr1 to Tr4 or Tr2 to Tr5 having sizes changing in progression.

In this case, the size of the output driving transistor corresponding to the upper limit of the impedance to be covered is set to (size Won+sizes of those of the fine adjustment transistors Tro1 to Tro6 which are used.) and the size of the output driving transistor corresponding to the lower limit of the impedance to be covered is set to (size Won+sizes of those of the fine adjustment transistors Tro1 to Tro6 which are used+30×Wu).

As described above, in the output circuit of the memory IC of this embodiment, if the programmable impedance buffer function for adjusting the impedance of the output driving transistor to a desired value by changing the size of the output driving transistor according to the control signals of four bits is provided, the offset transistor Tro and the fine adjustment transistors Tro1 to Tro6 therefor and the five transistors Tr1 to Tr5 having different sizes increasing in progression are provided as the constituent elements of the output driving transistor and connection of the control signals C0 to C3 of four bits to the five transistors Tr1 to Tr5 can be selectively changed by use of the option lines 11a or 11b so that the channel width W of the output driving transistor can be finely adjusted in a wide control range.

That is, according to the output circuit of the memory IC of this embodiment, in a case wherein the programmable impedance buffer function for adjusting the impedance of the output circuit according to the external impedance is provided, the channel width W can be easily changed even if the gate width L of the output driving transistor is changed after the design thereof, it becomes unnecessary to prepare size adjusting transistors of a number which is several times the number n of bits of the impedance adjusting control signals or use transistors whose channel width W has such a size as to cause a problem of narrow channel effect, and as a result, the size of the output driving transistor can be changed with the impedance matching precision kept high without increasing the cost.

Figure 9:
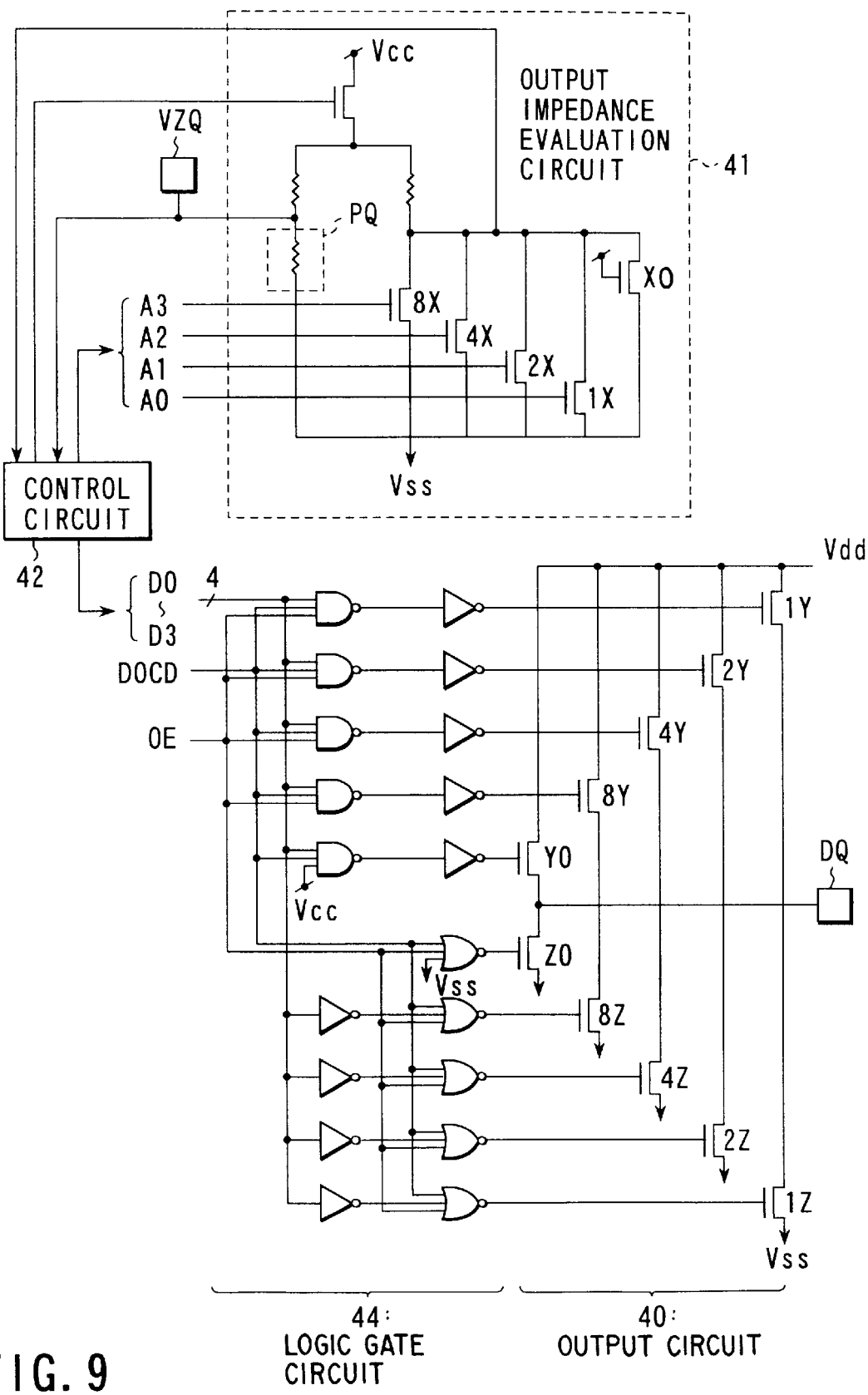
FIG. 9 is a circuit diagram showing a conventional programmable impedance buffer circuit.
Figure 10:
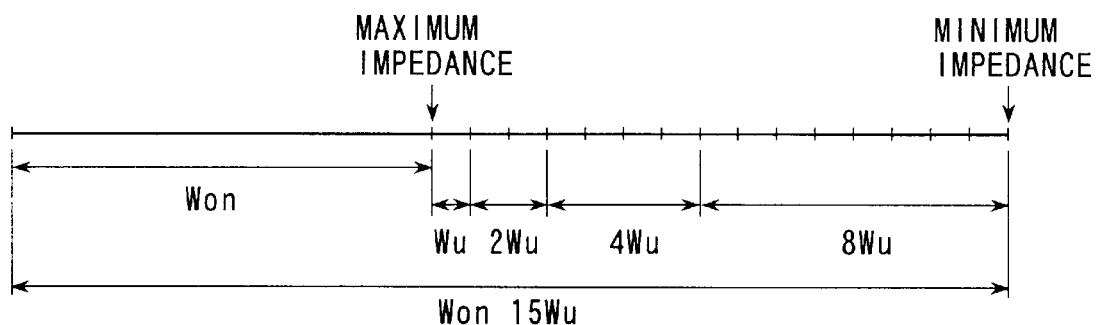
FIG. 10 is a diagram showing the variable range (the cover range of the output impedance) of the size of an output driving transistor realized by the circuit of FIG. 9.
Figure 11:
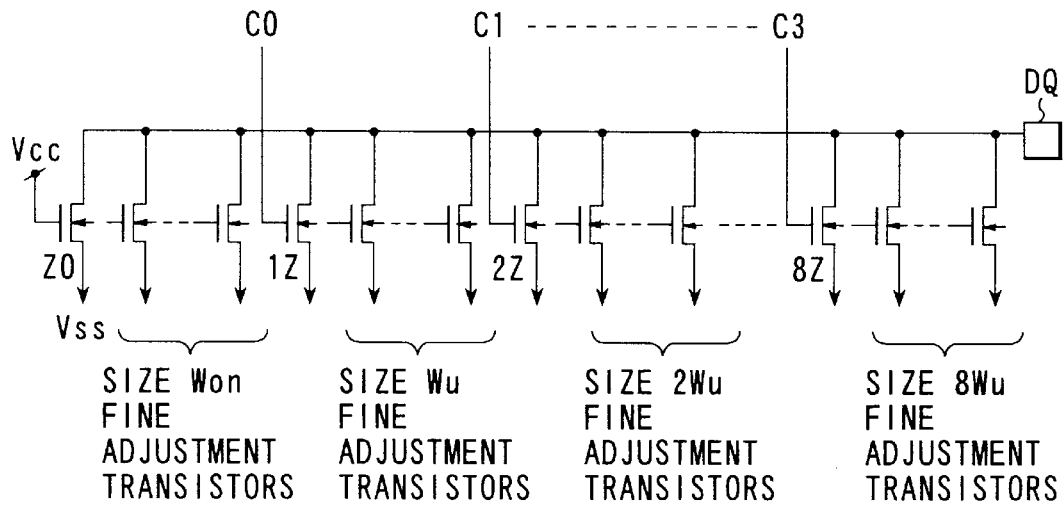
FIG. 11 is a circuit diagram showing an example in which a large number of transistors are attached to each of the output driving transistors having different sizes to adjust the channel width W of the output driving transistor of FIG. 9.

The control circuit 20 for supplying the control signals C0 to C3 of four bits to the option lines (four output control signal lines) 11a logically processes an output permission control signal OE for controlling whether m MOS transistors Tr1 to Tr4 or Tr2 to Tr5 which are selectively used are made conductive or not, output impedance control signals A0 to A3 for selectively making the m MOS transistors conductive to control the output impedance of the external output node to a desired value (that is, the output impedance of the external output node is set to a desired value by use of the transistors among the m MOS transistors Tr1 to Tr4 or Tr2 to Tr5 which are selectively made conductive and the transistors among the fine adjustment transistors Tro1 to Tro6 of the offset transistor Tro which are fixed in the conductive state) and output data DATA from the internal circuit of the IC (for example, derive the logical AND by use of the logic gate circuit 44 as shown in FIG. 9) so as to control the logical levels of the control signals C0 to C3.

As described before with reference to FIG. 9, the output impedance control signals A0 to A3 input to the control circuit 20 are control signals formed to automatically change the size of the output driving transistor to attain matching between the impedance of the output circuit and the impedance of the element RQ when the user externally connects the element RQ having a desired value to the external terminal VZQ as the impedance of the output bus to be connected to the output terminal DQ.

In this case, as described before with reference to FIG. 9, a plurality of evaluation transistors having the same sizes as the transistors constituting the output driving transistor are prepared as a means for evaluating the output impedance of the output driving transistor, four of the evaluation transistors which have the same sizes as the four transistors Tr1 to Tr4 or Tr2 to Tr5 of the output driving transistor connected by the option lines 11a or 11b are selected and the gates of the selected evaluation transistors are controlled by bits of evaluation control signals of four bits to selectively control the ON/OFF states of the four evaluation transistors so that the size of the evaluation transistor can be changed.

The evaluation control signals are changed while monitoring the impedance matching state between the evaluation transistors and the element RQ and the contents of the evaluation control signals set when the matching is attained are stored into a register circuit and the control signals C0 to C3 of four bits may be output from the control circuit 20 at an adequate timing based on the stored contents.

Alternatively, the contents of the control signals determined based on the result of monitoring of the impedance matching state at a timing which does not cause any trouble in operation with the load (such as an MPU) actually connected to the data output terminal DQ of the memory IC are stored in a register circuit and the control signals C0 to C3 of four bits may be output from the control circuit 20 at an adequate timing based on the stored contents.

In the above embodiment, a case wherein the offset transistor Tro and the fine adjustment transistors Tro1 to Tro6 are used is explained, but in a case wherein the fine adjustment transistors Tro1 to Tro6 are not used or the offset transistor Tro is not provided, the same operation as in the above embodiment can be attained for the output driving transistors Tr1 to Tr4 or Tr2 to Tr5 in the above embodiment.

Further, in the above embodiment, a case wherein the size of the output driving transistor on the pull-down side of the output circuit of the memory IC is variably controlled is explained, but in a case wherein the size of the output driving transistor on the pull-up side of the output circuit is variably controlled, the operation similar to that of the above embodiment can be effected. Further, this invention is not limited to the memory IC and can be applied to a case wherein the size of each of the output driving transistors of the pull-up side circuit and pull-down side circuit of the output circuit of the IC is variably controlled, and in this case, the same effect as that in the above embodiment can be attained.

Figure 5:
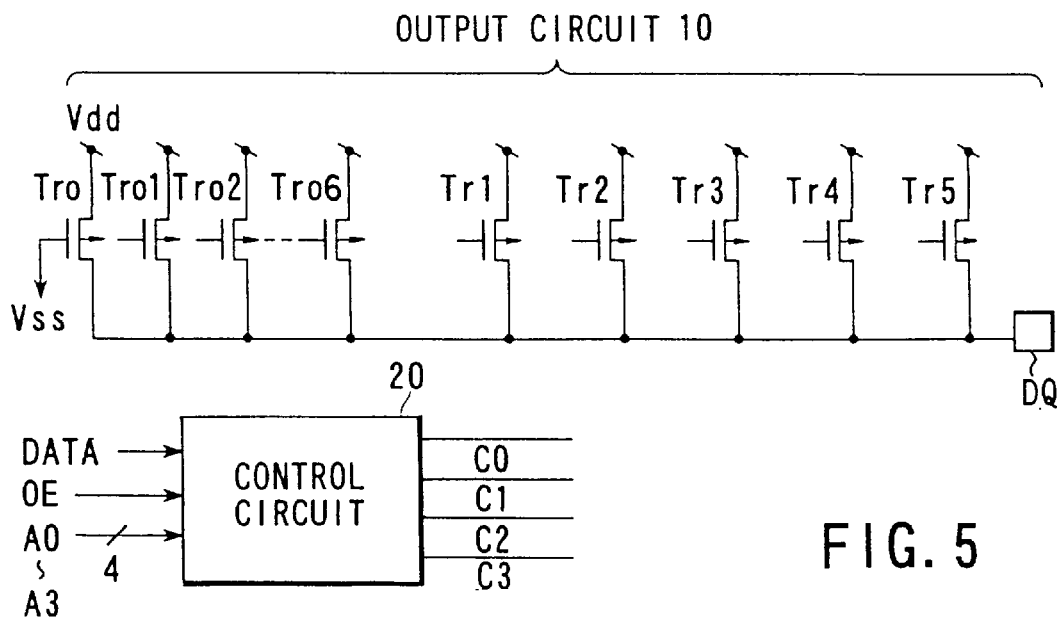
FIG. 5 is a modified circuit diagram of the FIG. 1 circuit diagram, in which N channel MOS transistors are replaced by P channel MOS transistors.
Figure 6:
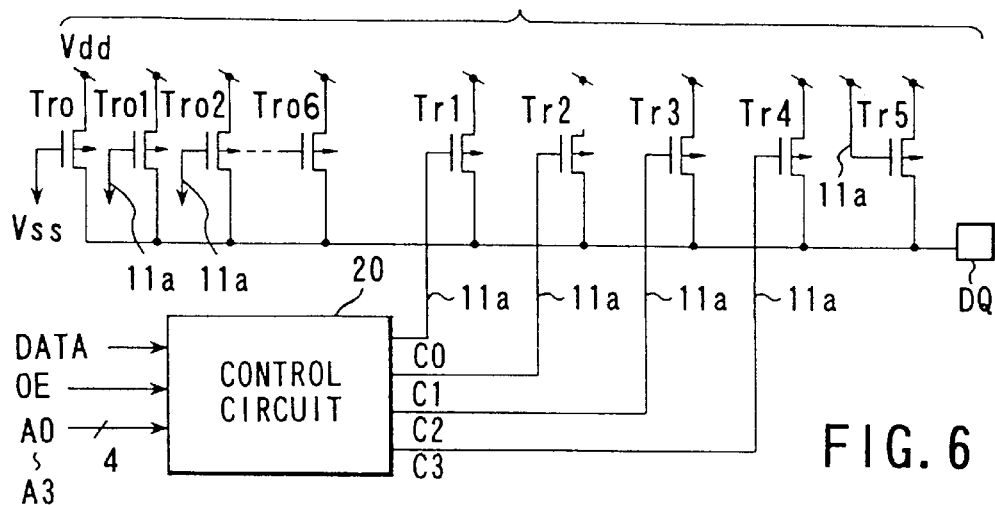
FIG. 6 is a modified circuit diagram of the FIG. 2 circuit diagram, in which N channel MOS transistors are replaced by P channel MOS transistors.
Figure 7:
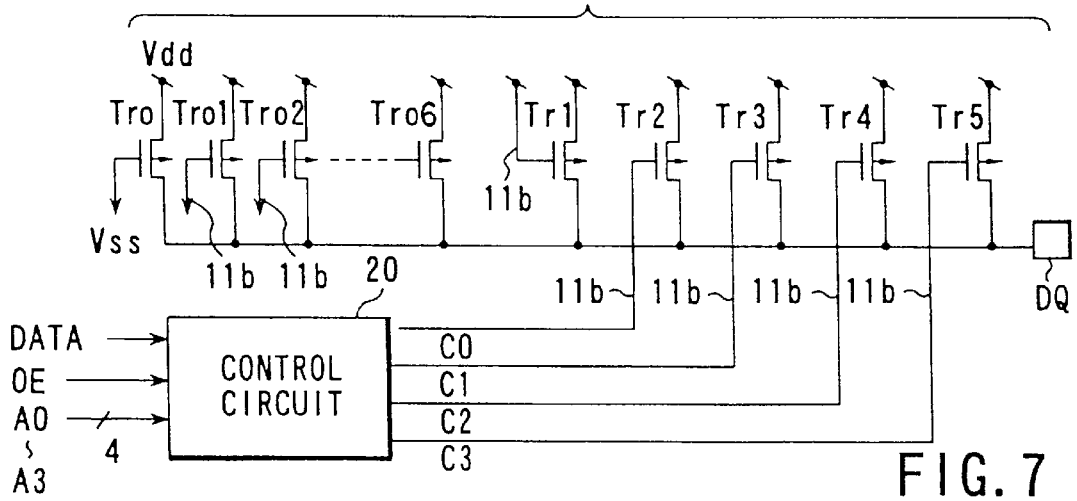
FIG. 7 is a modified circuit diagram of the FIG. 3 circuit diagram, in which N channel MOS transistors are replaced by P channel MOS transistors.

Also, in the above embodiment, the transistors Tro, Tro1 to Tro6, and Tr1 to Tr5 are described as each being formed of an N-channel MOS transistor. However, the transistors Tro, Tro1 to Tro6, and Tr1 to Tr5 are not necessarily limited as each being formed of an N-channel MOS transistor. The transistors Tro, Tro1 to Tro6, and Tr1 to Tr5 may be each formed of a P-channel MOS transistor, as shown in FIGS. 5, 6 and 7. In such a case, the sources of the current paths of the transistors Tro, Tro1 to Tro6, and Tr1 to Tr5 are connected to an external output node via the output pad DQ, and the drains thereof are connected to a node of a power supply potential Vdd.

Figure 8:
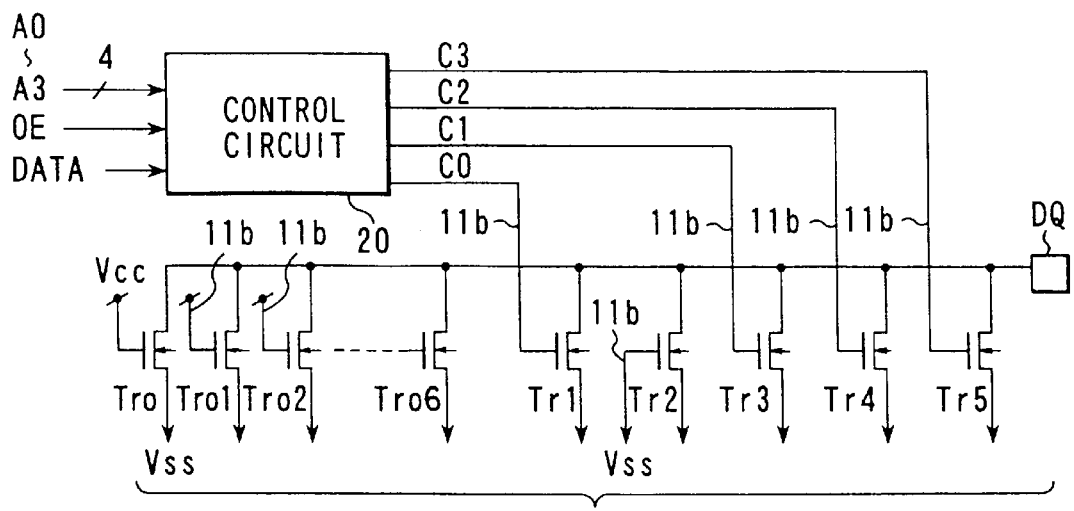
FIG. 8 is a modification of the circuit diagram shown in FIG. 3, in which the connection scheme of the control signals C0 to C3 to the MOS transistors differs from that shown in FIG. 3.

In the above embodiment, the states in which the control signals C0 to C3 of four bits are shifted by one bit as shown in FIGS. 2 and 3 to change the connection relation between the control signals C0 to C3 of four bits and the four transistors among the selective constituent elements of the output driving transistors are explained as an example, but the method for changing the connection relation is not limited to the above example. That is, as shown in FIG. 8, the control signals C0, C1 to C3 may be inputted to the gates of the transistors Tr1, Tr3 to Tr5, respectively, while the gate of the transistor Tr2 may be connected to ground potential Vss to render the transistor Tr2 nonconductive.

In the above embodiment, furthermore, the transistors Tr1 to Tr5 are described as having channel widths increasing in progression from $2^0$ times to $2^{(n-1)}$ times the unit channel width with the unit channel width (size) Wu of the transistor Tr1 used as a reference and the sizes are respectively set to Wu, 2×Wu, 4×Wu, 8×Wu, 16×Wu. However, the transistors Tr1 to Tr5 are not necessarily limited to have channel widths increasing in progression. The transistors Tr1 to Tr5 have channel widths at least different from each other.

In the above embodiment, an output circuit is described in relation to a pull down side output circuit comprising the transistors Tro, Tro1 to Tro6, and Tr1 to Tr5. The concept described in relation to the pull down side output circuit is similarly applied to a pull up side output circuit comprising transistors which correspond to the transistors Tro, Tro1 to Tro6, and Tr1 to Tr5 of the pull down side output circuit except that the transistors of the pull up side output circuit are so connected to a power supply potential and controlled by control signals to provide a pull up function.

As described above, according to the semiconductor integrated circuit of this invention, in a case wherein size adjusting transistors are provided for output driving transistors whose gate widths L may be changed as the result of evaluation of the ESD withstand voltage and reliability on the actual IC chip to provide the programmable impedance buffer function, the matching with respect to the manufacturing process can be enhanced, the impedance matching precision can be enhanced and the manufacturing cost can be made low.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor integrated circuit comprising:
   n MOS transistors having current paths connected at one-side ends to an external output node and having channel widths increasing in progression from $2^0$ times to $2^{(n-1)}$ times the unit channel width;
   m output control signal lines connected to gate nodes of m transistors which are part of said n MOS transistors, where n>m; and
   state fixing lines connected to gate electrodes of the remaining (n–m) transistors among said n MOS transistors, for fixedly setting the (n–m) transistors into the nonconductive state.

2. The semiconductor integrated circuit according to claim 1, wherein output control signals supplied to said m output control signal lines are signals obtained by logically processing an output permission control signal for controlling whether said m MOS transistors can be made conductive or not, an output impedance control signal for selectively controlling the conduction states of said m MOS transistors to control the output impedance of the external output node to a desired value, and output data from an internal circuit of the integrated circuit.

3. The semiconductor integrated circuit according to claim 1, further comprising p MOS transistors whose current paths are connected at one-side ends to the external output node; and state fixing lines for selectively coupling the gate nodes of said p MOS transistors to a fixed level for setting the nonconductive state or a fixed level for setting the conductive state to selectively fix said p MOS transistors in the nonconductive or conductive state.

4. The semiconductor integrated circuit according to claim 3, wherein output control signals supplied to said m output control signal lines are signals obtained by logically processing an output permission control signal for controlling and permitting said m MOS transistors to be set in the output permissible state, an output impedance control signal for selectively controlling the conduction states of said m MOS transistors to control the output impedance of the external output node to a desired value, and output data from an internal circuit of the integrated circuit.

5. The semiconductor integrated circuit according to claim 1, which comprises an output circuit including a pull-up circuit and in which said MOS transistors are used in said pull-up circuit of said output circuit of the integrated circuit.

6. The semiconductor integrated circuit according to claim 1, which comprises an output circuit including a pull-down circuit and in which said MOS transistors are used in said pull-down circuit of said output circuit of the integrated circuit.

7. The semiconductor integrated circuit according to claim 1, which comprises an output circuit including a pull-up circuit and pull-down circuit and in which said MOS transistors are used in said pull-up circuit and pull-down circuit of said output circuit of the integrated circuit.

8. The semiconductor integrated circuit according to claim 1, wherein said output control signal lines and state fixing lines are option lines.

9. The semiconductor integrated circuit according to claim 8, wherein said option lines are determined as the result of evaluation of at least one performance characteristic on an actual IC chip.

10. The semiconductor integrated circuit according to claim 9, wherein said at least one performance characteristic contains a performance characteristic of ESD withstand voltage and reliability.

11. A semiconductor integrated circuit comprising:
    n MOS transistors having current paths connected at one-side ends to an external output node and having channel widths different from each other;
    m output control signal lines connected to gate nodes of m transistors which are part of said n MOS transistors, where n>m; and
    state fixing lines connected to gate electrodes of the remaining (n–m) transistors among said n MOS transistors, for fixedly setting the (n–m) transistors into the nonconductive state.

12. The semiconductor integrated circuit according to claim 11, wherein output control signals supplied to said m output control signal lines are signals obtained by logically processing an output permission control signal for controlling whether said m MOS transistors can be made conductive or not, an output impedance control signal for selectively controlling the conduction states of said m MOS transistors to control the output impedance of the external output node to a desired value, and output data from an internal circuit of the integrated circuit.

13. The semiconductor integrated circuit according to claim 11, further comprising p MOS transistors whose current paths are connected at one-side ends to the external output node; and state fixing lines for selectively coupling the gate nodes of said p MOS transistors to a fixed level for setting the nonconductive state or a fixed level for setting the conductive state to selectively fix said p MOS transistors in the nonconductive or conductive state.

14. The semiconductor integrated circuit according to claim 13, wherein output control signals supplied to said m output control signal lines are signals obtained by logically processing an output permission control signal for controlling and permitting said m MOS transistors to be set in the output permissible state, an output impedance control signal for selectively controlling the conduction states of said m MOS transistors to control the output impedance of the external output node to a desired value, and output data from an internal circuit of the integrated circuit.

15. The semiconductor integrated circuit according to claim 11, which comprises an output circuit including a pull-up circuit and in which said MOS transistors are used in said pull-up circuit of said output circuit of the integrated circuit.

16. The semiconductor integrated circuit according to claim 11, which comprises an output circuit including a pull-down circuit and in which said MOS transistors are used in said pull-down circuit of said output circuit of the integrated circuit.

17. The semiconductor integrated circuit according to claim 11, which comprises an output circuit including a pull-up circuit and pull-down circuit and in which said MOS transistors are used in said pull-up circuit and pull-down circuit of said output circuit of the integrated circuit.

18. The semiconductor integrated circuit according to claim 11, wherein said output control signal lines and state fixing lines are option lines.

19. The semiconductor integrated circuit according to claim 18, wherein said option lines are determined as the result of evaluation of at least one performance characteristic on an actual IC chip.

20. The semiconductor integrated circuit according to claim 19, wherein said at least one performance characteristic contains a performance characteristic of ESD withstand voltage and reliability.

21. The semiconductor integrated circuit according to claim 1, wherein said n MOS transistors are N channel MOS transistors.

22. The semiconductor integrated circuit according to claim 1, wherein said n MOS transistors are P channel MOS transistors.

23. The semiconductor integrated circuit according to claim 11, wherein said n MOS transistors are N channel MOS transistors.

24. The semiconductor integrated circuit according to claim 11, wherein said n MOS transistors are P channel MOS transistors.

* * * * *